United States Patent
Das et al.

(10) Patent No.: US 11,124,740 B2
(45) Date of Patent: Sep. 21, 2021

(54) POST CHEMICAL MECHANICAL POLISHING CLEANING COMPOSITIONS

(71) Applicant: ENTEGRIS, INC., Billerica, MA (US)

(72) Inventors: Atanu K. Das, Danbury, CT (US); Michael White, Ridgefield, CT (US); Daniela White, Ridgefield, CT (US)

(73) Assignee: ENTEGRIS, INC., Billerica, MA (US)

(*) Notice: Subject to any disclaimer, the term of this patent is extended or adjusted under 35 U.S.C. 154(b) by 0 days.

(21) Appl. No.: 16/689,850

(22) Filed: Nov. 20, 2019

(65) Prior Publication Data

US 2020/0181535 A1 Jun. 11, 2020

Related U.S. Application Data

(60) Provisional application No. 62/777,478, filed on Dec. 10, 2018.

(51) Int. Cl.
| | | |
|---|---|---|
| *C11D 7/32* | (2006.01) | |
| *C11D 3/28* | (2006.01) | |
| *C11D 1/72* | (2006.01) | |
| *H01L 21/02* | (2006.01) | |
| *C11D 3/36* | (2006.01) | |
| *C11D 3/30* | (2006.01) | |

(52) U.S. Cl.
CPC ............ *C11D 3/28* (2013.01); *C11D 1/72* (2013.01); *C11D 3/30* (2013.01); *C11D 3/361* (2013.01); *H01L 21/02065* (2013.01)

(58) Field of Classification Search
CPC .................................................. C11D 11/0047
USPC ................................................................. 510/175
See application file for complete search history.

(56) References Cited

U.S. PATENT DOCUMENTS

| | | | |
|---|---|---|---|
| 6,676,492 | B2 | 1/2004 | Li |
| 7,314,578 | B2 | 1/2008 | Choi |
| 2003/0047710 | A1 | 3/2003 | Babu |
| 2006/0293208 | A1 | 12/2006 | Egbe |
| 2009/0133716 | A1* | 5/2009 | Lee .................. H01L 21/02063 134/3 |
| 2011/0136717 | A1 | 6/2011 | Tamboli |

(Continued)

FOREIGN PATENT DOCUMENTS

| | | |
|---|---|---|
| JP | 2012072267 A | 4/2012 |
| KR | 20060119117 A | 11/2006 |
| WO | 2018136511 A1 | 7/2018 |

OTHER PUBLICATIONS

Canham, L.T. et al.; "Characterization of microporous Si by flow calorimetry: Comaprison with a hydrophobic SiO2 molecular sieve"; Journal of Applied Physics vol. 72, No. 4, pp. 1558-1565; 1992.

(Continued)

*Primary Examiner* — Gregory E Webb
(74) *Attorney, Agent, or Firm* — Entegris, Inc.

(57) ABSTRACT

A removal composition and process for cleaning post-chemical mechanical polishing (CMP) contaminants and ceria particles from a microelectronic device having said particles and contaminants thereon. The composition achieves highly efficacious removal of the ceria particles and CMP by-product contaminant material from the surface of the microelectronic device without compromising the low-k dielectric, silicon nitride, or tungsten-containing materials.

18 Claims, 10 Drawing Sheets

(56) References Cited

U.S. PATENT DOCUMENTS

2011/0180747 A1* 7/2011 Lee .................. C23G 1/066
252/79.1
2018/0037852 A1 2/2018 Thomas

OTHER PUBLICATIONS

Shah, V. et al.; "Antibacterial Activity of Polymer Coated Cerium Oxide Nanoparticles"; PLoS One 7(10) e47827; Oct. 26, 2012.
Zhao, D. et al.; "Chemical Mechanical Polishing: Theory and Experiment"; Friction 1(4): 306-326; 2013.

* cited by examiner

POST CHEMICAL MECHANICAL POLISHING CLEANING COMPOSITIONS

FIELD OF THE INVENTION

The present invention relates generally to compositions for removing ceria particles and other chemical mechanical polishing slurry contaminants from microelectronic devices having same thereon.

BACKGROUND OF THE INVENTION

Microelectronic device wafers are used to form integrated circuits. The microelectronic device wafer includes a substrate, such as silicon, into which regions are patterned for deposition of different materials having insulative, conductive or semi-conductive properties.

In order to obtain the correct patterning, excess material used in forming the layers on the substrate must be removed. Further, to fabricate functional and reliable circuitry, it is important to prepare a flat or planar microelectronic wafer surface prior to subsequent processing. Thus, it is necessary to remove and/or polish certain surfaces of a microelectronic device wafer.

Chemical Mechanical Polishing or Planarization ("CMP") is a process in which material is removed from a surface of a microelectronic device wafer, and the surface is polished (e.g., planarized) by coupling a physical process such as abrasion with a chemical process such as oxidation or chelation. In its most rudimentary form, CMP involves applying an abrasive slurry having an active chemistry to a polishing pad that buffs the surface of a microelectronic device wafer during the removal, planarization, and polishing processes. Removal or polishing processes using purely physical or purely chemical action are not as effective as the synergistic combination of both in order to achieve fast, uniform removal. In addition, in the fabrication of integrated circuits, the CMP slurry should also be able to preferentially remove films that comprise complex layers of metals and other materials so that highly planar surfaces can be produced for subsequent photolithography, or patterning, etching and thin-film processing.

In a front-end-of-the-line (FEOL) method for forming an isolation region in a silicon substrate using the shallow trench isolation (STI) process, a pad oxide film and a pad nitride film are deposited on a semiconductor substrate and patterned to expose portions of the substrate, which correspond to an isolation region. Then, the exposed regions of the substrate are etched to form a trench. Thereafter, the substrate is subjected to a sacrificial oxidation process to remove damage caused by the substrate etching followed by formation of a wall oxide film on the surface of the trench. Next, a trench-buried oxide film (e.g., an oxide film formed by high density plasma chemical vapor deposition referred to as an HDP-oxide film), is deposited on the surface of the substrate in such a manner as to be buried in the trench. Then, the surface of the HDP-oxide film is subjected to chemical mechanical polishing until the pad nitride film is exposed. The resulting substrate is then cleaned and the pad nitride film which was used as an etch barrier during the trench etch is removed, completing the formation of an isolation region.

A CMP slurry using ceria particles generally achieves a faster polishing speed for an insulator, relative to a silica-containing slurry. Moreover, a ceria-based slurry is most often used because of the ability to achieve STI pattern planarization with minimal oxide erosion. Disadvantageously, ceria-based slurries are difficult to remove from STI structures because of the oppositely charged zeta potentials of the ceria particles relative to the silicon oxide and silicon nitride surfaces. If a device is manufactured with these residues remaining on the wafer, the residues will lead to short circuits and an increase in electrical resistance. Ceria particles are also a problem with FinFET structures following CMP processing using ceria slurries.

Currently, the most efficient wet cleaning formulation for removing ceria particles is dilute hydrofluoric acid (DHF). However, DHF disadvantageously etches silicon oxide and other low-k dielectric materials.

Therefore, a need remains for a ceria particle removal composition and process that effectively removes ceria particles from a surface of a microelectronic device while not damaging the underlying materials such as silicon nitride, low-k dielectrics (e.g., silicon oxide), and tungsten-containing layers. The ceria particle removal composition should also efficaciously remove CMP slurry contaminants from the surface of the microelectronic device.

SUMMARY OF THE INVENTION

The present invention generally relates to a removal composition and process, particularly useful for cleaning ceria particles and CMP contaminants from microelectronic devices having said particles and CMP contaminants thereon, in particular microelectronic devices having PETEOS, Silicon Nitride, and Poly-Si substrates. In one aspect, an aqueous removal composition is described, said composition comprising a nucleophile or a reducing agent, effective in facilitating the removal of cerium, certain surfactants and complexing agents, and optionally other ingredients. In another aspect, a method of removing ceria particles and CMP contaminants from a microelectronic device having said particles and contaminants thereon is provided, said method comprising contacting the microelectronic device with a removal composition for a sufficient time to at least partially clean said particles and contaminants from the microelectronic device, wherein said removal composition comprises a reducing agent or nucleophilic compound, certain surfactants, complexing agents, and optionally other ingredients. The surfactant serves to prevent re-deposition of the ceria on the device surface, and in certain instances facilitates removal due to shifting of the equilibria of the reaction to complexation of the ceria species.

DETAILED DESCRIPTION OF THE INVENTION

Figure 1:
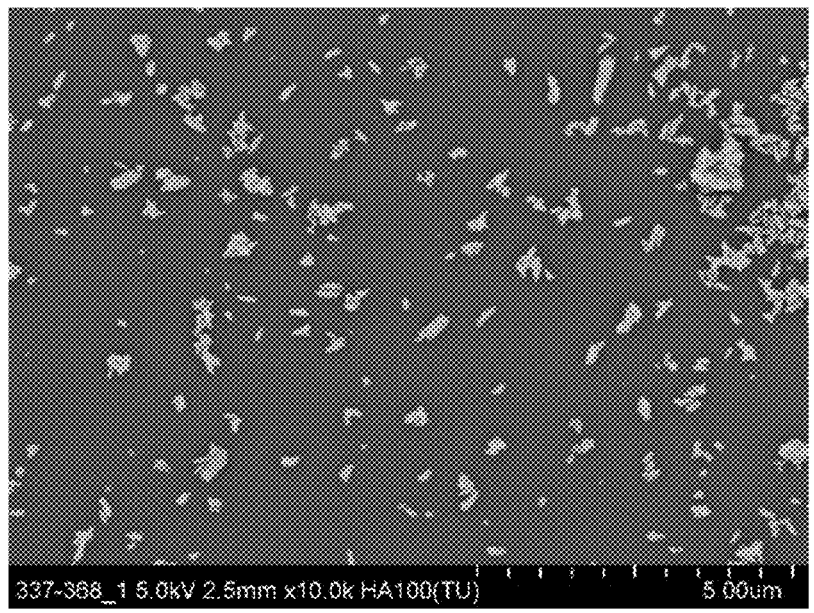
FIG. 1 is a scanning electron micrograph (SEM) of a Poly-Si substrate post chemical mechanical polishing (post-CMP) but before treatment with the compositions of the invention.
Figure 2:
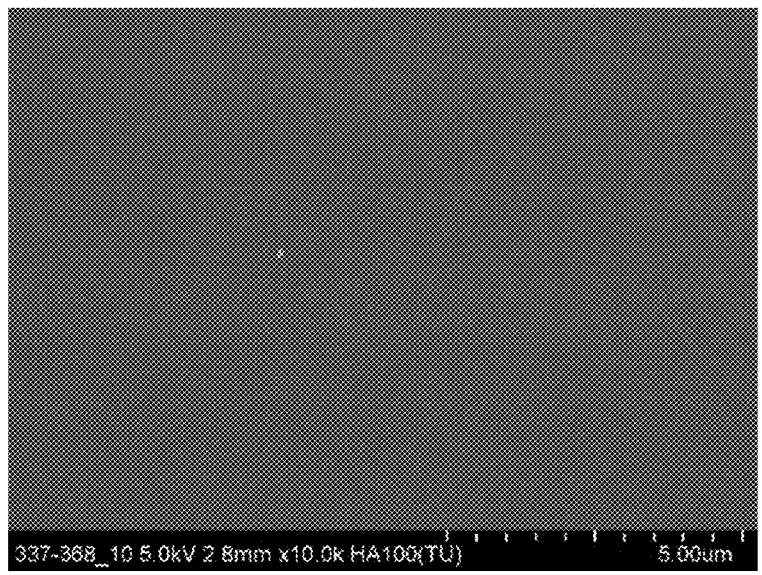
FIG. 2 is an SEM of a post-CMP Poly-Si substrate after treatment with the composition of Example 9.
Figure 3:
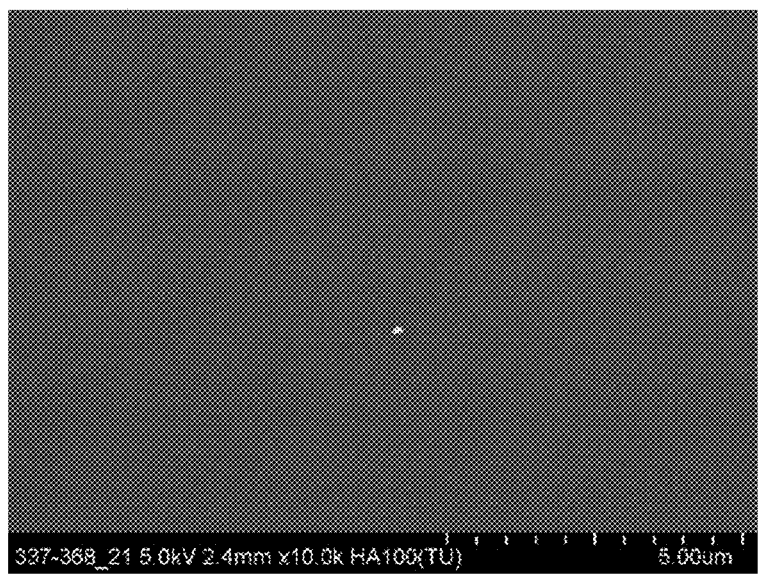
FIG. 3 is an SEM of a post-CMP Poly-Si substrate after treatment with the composition of Example 17.
Figure 4:
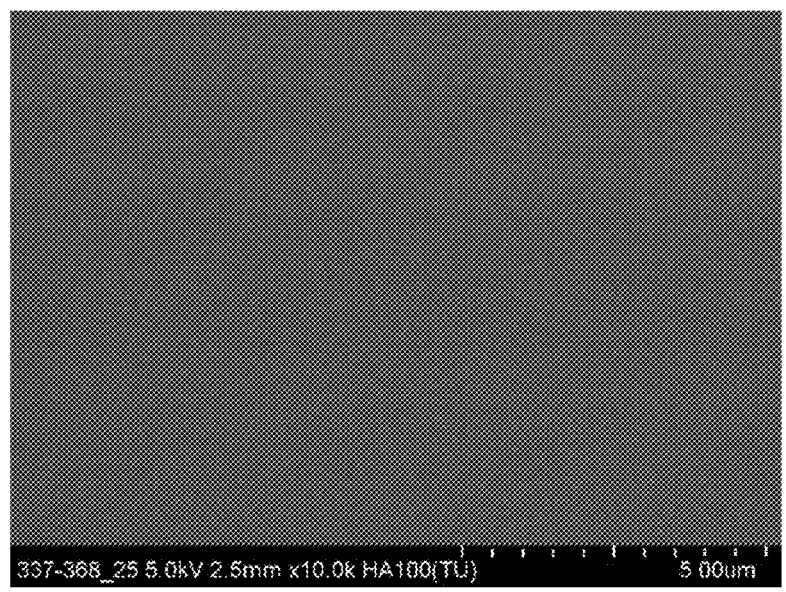
FIG. 4 is an SEM of a post-CMP Poly-Si substrate after treatment with the composition of Example 19.
Figure 5:
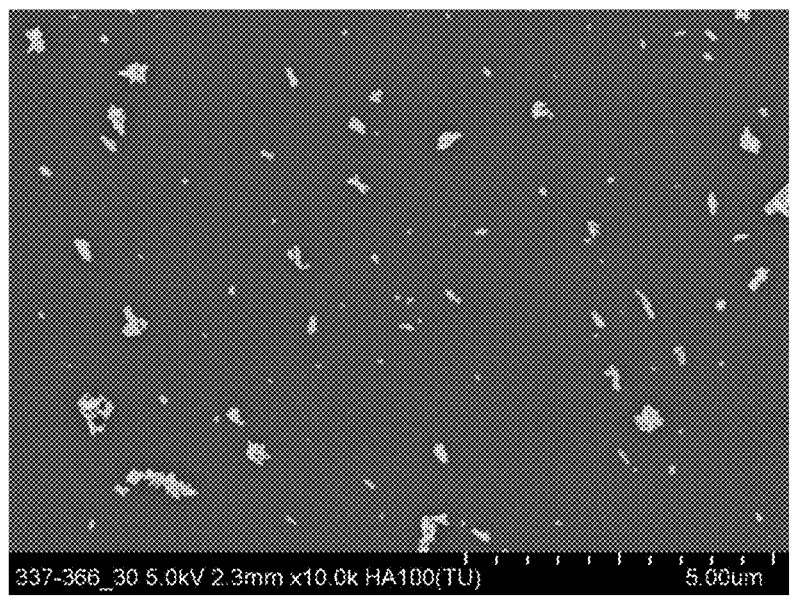
FIG. 5 is an SEM of a PETEOS substrate post chemical mechanical polishing but before treatment with the compositions of the invention.
Figure 6:
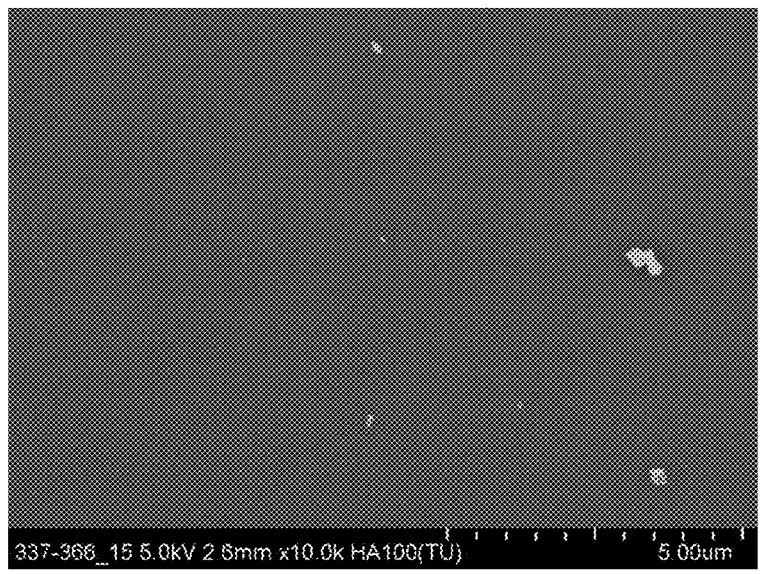
FIG. 6 is an SEM of a post-CMP PETEOS substrate after treatment with the composition of Example 14.
Figure 7:
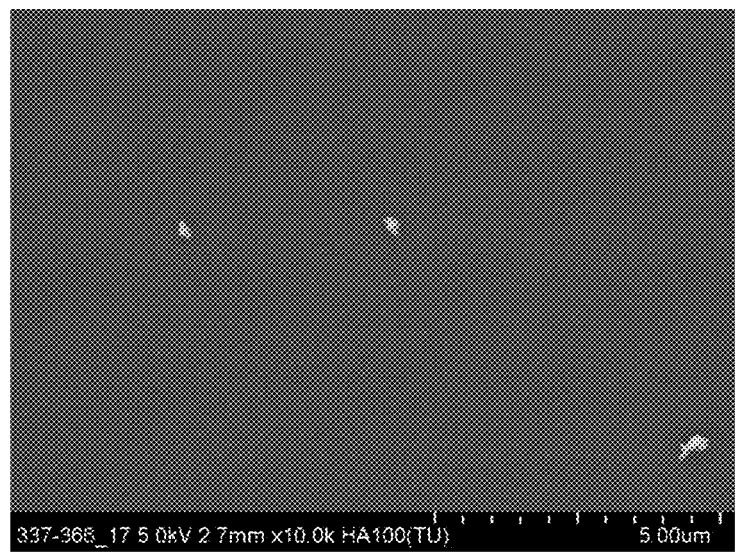
FIG. 7 is an SEM of a post-CMP PETEOS substrate after treatment with the composition of Example 25.
Figure 8:
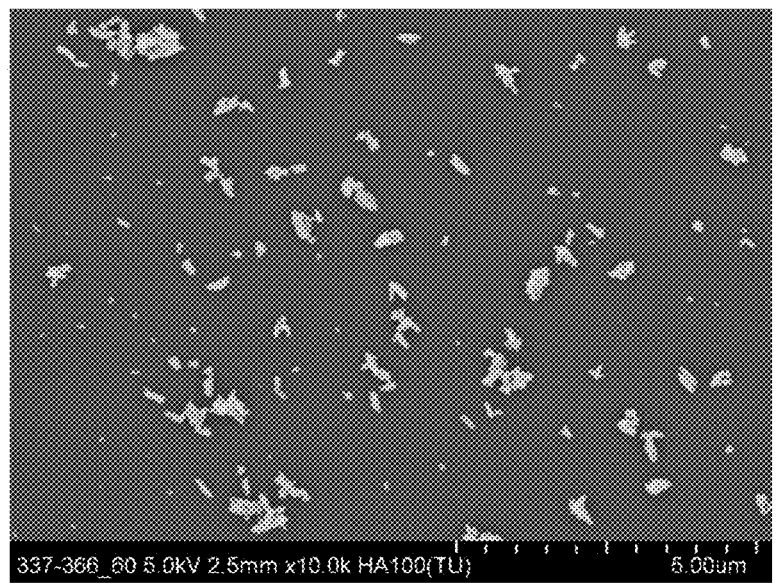
FIG. 8 is an SEM of a silicon nitride substrate post chemical mechanical polishing but before treatment with the compositions of the invention.
Figure 9:
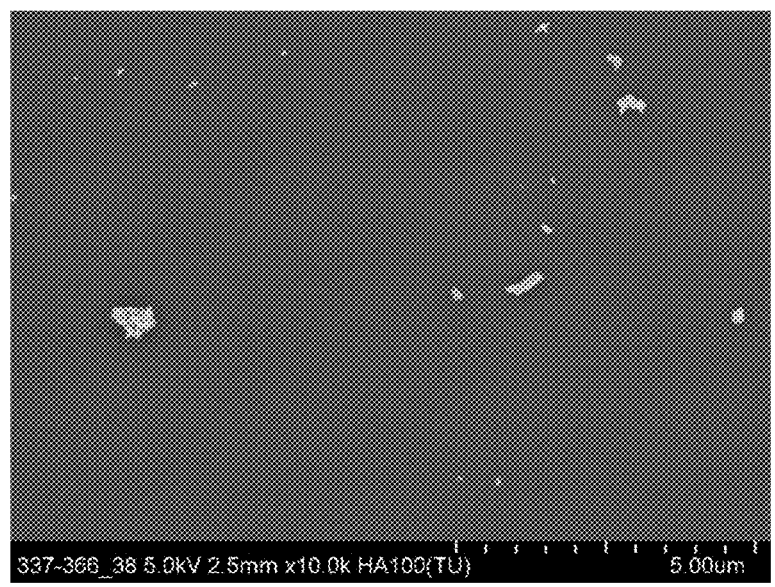
FIG. 9 is an SEM of a post-CMP silicon nitride substrate after treatment with the composition of Example 7.
Figure 10:
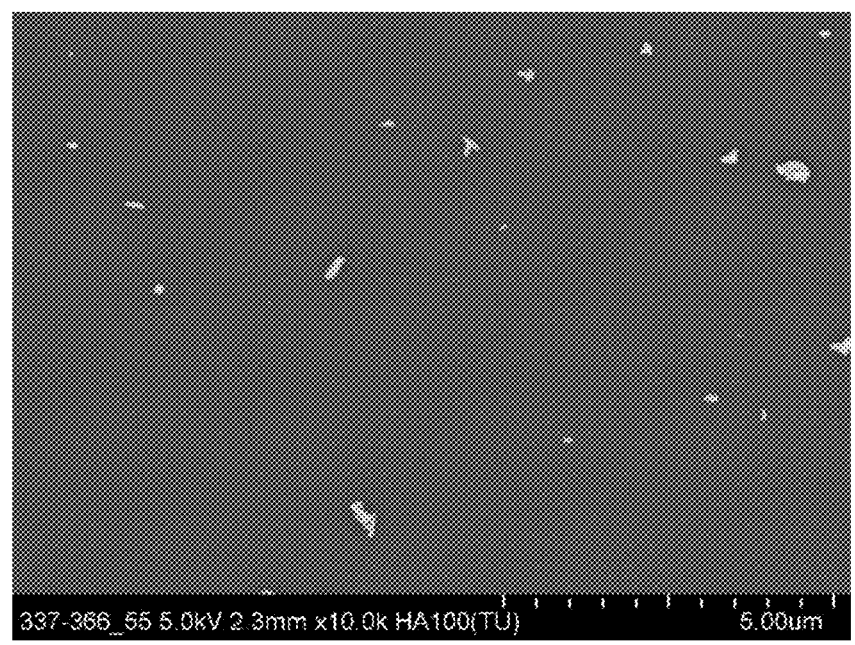
FIG. 10 is an SEM of a post-CMP silicon nitride substrate after treatment with the composition of Example 24.

The present invention relates generally to compositions useful for the removal of ceria particles and CMP contaminants from a microelectronic device having such material(s) thereon. Advantageously, the ceria particles and CMP contaminants are efficaciously removed using the compositions and further the compositions are compatible with silicon nitride and low-k dielectric (e.g., silicon oxide) layers. At lower pH ranges, a reducing agent is utilized to break the cerium-oxygen bond and at higher pH, a nucleophile is utilized to break the cerium-oxygen bond.

For ease of reference, "microelectronic device" corresponds to semiconductor substrates, flat panel displays, phase change memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As used herein, "ceria particles" corresponds to cerium-based abrasive particles that may be used in chemical mechanical polishing slurries, including, for example, a cerium oxide having the formula $Ce_2O_3$ and $CeO_2$. It should be appreciated that the "ceria particles" may comprise, consist of, or consist essentially of cerium oxide.

As used herein, "contaminants" correspond to chemicals present in the CMP slurry, reaction by-products of the polishing slurry, post-CMP residue, chemicals present in the wet etching composition, reaction by products of the wet etching composition, and any other materials that are the by-products of the CMP process, the wet etching, the plasma etching or the plasma ashing process.

As used herein, "post-CMP residue" corresponds to particles from the polishing slurry, e.g., chemicals present in the slurry, reaction by-products of the polishing slurry, carbon-rich particles, polishing pad particles, brush deloading particles, equipment materials of construction particles, metal, organic residues, and any other materials that are the by-products of the CMP process. In addition, if tungsten was removed during the CMP process, the post-CMP residue can further comprise tungsten-containing particles.

As defined herein, "low-k dielectric material" corresponds to any material used as a dielectric material in a layered microelectronic device, wherein the material has a dielectric constant less than about 3.5. In general, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "complexing agent" includes those compounds that are understood by one skilled in the art to be complexing agents, chelating agents and/or sequestering agents. Complexing agents will chemically combine with or physically hold the metal atom and/or metal ion to be removed using the compositions described herein.

"Substantially devoid" is defined herein as less than 2 wt. %, less than 1 wt. %, less than 0.5 wt. %, or less than 0.1 wt. %. "Devoid" is intended to correspond to less than 0.001 wt % to account for environmental contamination.

As used herein, "about" is intended to correspond to +/−0.5% of the stated value.

As used herein, "oxidizing agents" correspond to compounds that oxidize exposed metal(s) resulting in corrosion of the metal or oxide formation on the metal. Oxidizing agents include, but are not limited to: hydrogen peroxide; other percompounds such as salts and acids containing peroxomonosulfate, perborate, perchlorate, periodate, persulfate, permanganate, and peracetate anions; and amine-N-oxides.

As used herein, "fluoride containing compounds" correspond to salts or acid compounds comprising a fluoride ion ($F^-$) that is ionically bonded to another atom.

As defined herein, the term "barrier material" corresponds to any material used in the art to seal the metal lines (e.g., copper interconnects) to minimize the diffusion of said metal (e.g., copper) into the dielectric material. Preferred barrier layer materials include tantalum, titanium, ruthenium, hafnium, tungsten, and other refractory metals and their nitrides and silicides.

As used herein, "surfactants" correspond to amphiphilic species having hydrophobic groups and hydrophilic groups, as readily understood by those skilled in the art, but do not include polymeric surfactants. As defined herein, "polymers" correspond to species that have repeating monomeric groups, and can be natural or synthetic. It should be appreciated that a "polymer" can be a homopolymer, having only one type of repeating monomer, or a co-polymer, having more than one type of repeating monomer. Surfactants for use in the compositions described herein include, but are not limited to, amphoteric salts, cationic surfactants, anionic surfactants, zwitterionic surfactants, non-ionic surfactants, and combinations thereof including, but not limited to, decylphosphonic acid, dodecylphosphonic acid (DDPA), tetradecylphosphonic acid, hexadecylphosphonic acid, bis (2-ethylhexyl)phosphate, octadecylphosphonic acid, perfluoroheptanoic acid, prefluorodecanoic acid, trifluoromethanesulfonic acid, phosphonoacetic acid, dodecylbenzenesulfonic acid (DDBSA), other R1-benzene sulfonic acids or salts thereof (where the R1 is a straight-chained or branched $C_8$-$C_{18}$ alkyl group), dodecenylsuccinic acid, dioctadecyl hydrogen phosphate, octadecyl dihydrogen phosphate, dodecylamine, dodecenylsuccinic acid monodiethanol amide, lauric acid, palmitic acid, oleic acid, juniperic acid, 12 hydroxystearic acid, octadecylphosphonic acid (ODPA), dodecyl phosphate. Non-ionic surfactants contemplated include, but are not limited to, polyoxyethylene lauryl ether, dodecenylsuccinic acid monodiethanol amide, ethylenediamine tetrakis (ethoxylate-block-propoxylate) tetrol, polyethylene glycols, polypropylene glycols, polyethylene or polypropylene glycol ethers, block copolymers based on ethylene oxide and propylene oxide, polyoxypropylene sucrose ether, t-octylphenoxypolyethoxyethanol, 10-ethoxy-9,9-dimethyldecan-1-amine, Polyoxyethylene (9) nonylphenylether, branched, Polyoxyethylene (40) nonylphenylether, branched, dinonylphenyl polyoxyethylene, nonylphenol alkoxylates, polyoxyethylene sorbitol hexaoleate, polyoxyethylene sorbitol tetraoleate, polyethylene glycol sorbitan monooleate, sorbitan monooleate, alcohol alkoxylates, alkyl-polyglucoside, ethyl perfluorobutyrate, 1,1,3,3,5,5-hexamethyl-1,5-bis[2-(5-norbornen-2-yl)ethyl]trisiloxane, monomeric octadecylsilane derivatives, siloxane modified polysilazanes, silicone-polyether copolymers, and ethoxylated fluorosurfactants. Cationic surfactants contemplated include, but are not limited to, cetyl trimethylammonium bromide (CTAB), heptadecanefluorooctane sulfonic acid, tetraethylammonium, stearyl trimethylammonium chloride, 4-(4-diethylaminophenylazo)-1-(4-nitrobenzyl)pyridium bromide, cetylpyridinium chloride monohydrate, benzalkonium chloride, benzethonium chloride, benzyldimethyldodecylammonium chloride, benzyldimethylhexadecylammonium chloride, hexadecyltrimethylammonium bromide, dimethyldioctadecylammonium chloride, dodecyltrimethylammonium chloride, hexadecyltrimethylammonium p-toluenesulfonate, didodecyldimethylammonium bromide, di(hydrogenated tallow)dimethylammonium chloride, tetraheptylammonium bromide, tetrakis(decyl)ammonium bromide, and oxyphenonium bromide, guanidine hydrochloride ($C(NH_2)_3Cl$) or triflate salts such as tetrabutylammonium trifluoromethanesulfonate, dimethyldioctadecylammonium chloride, dimethyldihexadecylammonium bromide, di(hydrogenated tallow) dimethylammonium chloride, and polyoxyethylene (16) tallow ethylmonium ethosulfate. Anionic surfactants contemplated include, but are not limited to, poly(acrylic acid sodium salt), ammonium polyacrylate, sodium polyoxyethylene lauryl ether, sodium dihexylsulfosuccinate, sodium dodecyl sulfate, dioctylsulfosuccinate salt, 2-sulfosuccinate salts, 2,4,7,9-tetramethyl-5-decyne-4,7-diol and its ethoxy derivatives, 2,3-dimercapto-1-propanesulfonic acid salt, dicyclohexyl sulfosuccinate sodium salt, sodium 7-ethyl-2-methyl-4-undecyl sulfate, phosphate fluorosurfactants, fluorosurfactants, and polyacrylates. Zwitterionic surfactants include, but are not limited to, acetylenic diols or modified acetylenic diols, ethylene oxide alkylamines, N,N-dimethyldodecylamine N-oxide, sodium cocaminpropinate, 3-(N, N-dimethylmyristylammonio)propanesulfonate, and (3-(4-heptyl)phenyl-3-hydroxypropyl) dimethylammoniopropanesulfonate.

As used herein, "suitability" for removing ceria particles and CMP contaminants from a microelectronic device having said particles and contaminants thereon corresponds to at least partial removal of said particles/contaminants from the microelectronic device. Cleaning efficacy is rated by the reduction of objects on the microelectronic device. For example, pre- and post-cleaning analysis may be carried out using an atomic force microscope. The particles on the sample may be registered as a range of pixels. A histogram (e.g., a Sigma Scan Pro) may be applied to filter the pixels in a certain intensity (e.g., 231-235) and the number of particles counted. The particle reduction may be calculated using:

$$\text{Cleaning Efficacy} = \frac{(\text{Number of } PreClean \text{ Objects} - \text{Number of } PostClean \text{ Objects})}{\text{Number of } PreClean \text{ Objects}} \times 100$$

Notably, the method of determination of cleaning efficacy is provided for example only and is not intended to be limited to same. Alternatively, the cleaning efficacy may be considered as a percentage of the total surface that is covered by particulate matter. For example, AFM's may be programmed to perform a z-plane scan to identify topographic areas of interest above a certain height threshold and then calculate the area of the total surface covered by said areas of interest. One skilled in the art would readily understand that the less area covered by said areas of interest post-cleaning, the more efficacious the removal composition. In certain embodiments, at least 75% of the particles/contaminants are removed from the microelectronic device using the compositions described herein, at least 90%, at least 95%, or at least 99% of the particles/contaminants are removed.

Compositions described herein may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.00001 weight percent, based on the total weight of the composition in which such components are employed.

In a first aspect, the invention provides a composition comprising
  (i) at least one surfactant
  (ii) at least one pH adjuster;
  (iii) at least one complexing agent;
  (iv) at least one organic additive; and
  (v) alternately at least one nucleophilic compound or reducing agent, wherein said nucleophilic compound is present when said composition possesses a pH of about 11 to 13.7, and wherein said reducing agent is present when said composition possesses a pH below 6.

In an additional embodiment, the invention provides a composition comprising
  (i) at least one surfactant
  (ii) at least one pH adjuster;
  (iii) at least one complexing agent;
  (iv) at least one organic additive; and
  (v) at least one nucleophilic compound, wherein said composition possesses a pH of about 11 to 13.7.

In an additional embodiment, the invention provides a composition comprising
  (i) at least one surfactant
  (ii) at least one pH adjuster;
  (iii) at least one complexing agent;
  (iv) at least one organic additive; and alternately
  (v) at least one reducing agent, wherein said composition possesses a pH of about 4 to 6.

As used herein, the term "nucleophilic compound" refers to compounds which are understood to act as nucelophiles in chemical reactions. In other words, a nucleophile is a chemical species that can donate an electron pair to an electrophile to form a chemical bond in relation to a reaction. In the case of the present invention at higher pH ranges of about 11 to 13.7, the nucleophilic compound is utilized and serves to break the cerium-oxygen bond; concomitant complexation of the ceria particles serves to facilitate its removal from the surface of the microelectronic device.

In one embodiment, the nucleophilic compound is an amine. Examples include monoethanolamine (MEA), morpholine, isopropyl amine, diisopropanolamine, diglycolamine, triethylamine, N-methylmorpholine, methylethanolamine, N-aminopropyl morpholine, and 3-aminopropanol.

Additional nucleophilic compounds include species having the general formula $NR^1R^2R^3$, wherein $R^1$, $R^2$ and $R^3$ may be the same as or different from one another and are chosen from hydrogen, straight-chain or branched $C_1$-$C_6$ alkyl (e.g., methyl, ethyl, propyl, butyl, pentyl, and hexyl) groups, straight-chain or branched $C_1$-$C_6$ hydroxyalkyl (e.g., hydroxymethyl, hydroxyethyl, hydroxypropyl, hydroxybutyl, hydroxypentyl, and hydroxyhexyl) groups, and $C_1$-$C_6$ alkyl ethers of straight chain or branched $C_1$-$C_6$ hydroxyalkyl groups as defined above. In certain embodiments, at least one of $R^1$, $R^2$ and $R^3$ is a straight-chain or branched $C_1$-$C_6$ hydroxyalkyl group. Examples include, without limitation, alkanolamines such as aminoethylethanolamine, N-methylaminoethanol, aminoethoxyethanol, dimethylaminoethoxyethanol, diethanolamine, N-methyldiethanolamine, monoethanolamine (MEA), triethanolamine (TEA), 1-amino-2-propanol, 2-amino-1-butanol, isobutanolamine, triethylenediamine, Triethylene tetramine, diethylenetriamne, methylmorpholine, ethylmorpholine, morpholine, 3-aminopropanol, dimethylaminopropan-3-ol, diglycolamine, trethylamine, benxylamine, aminomethylpropanol, dimethylaminopropanolamine other $C_1$-$C_8$ alkanolamines and combinations thereof. When the amine includes the alkylether component, the amine may be considered an alkoxyamine, e.g., 1-methoxy-2-aminoethane.

In the case of the present invention at lower pH ranges below 6, and this can be in a range 1-3, or 1-6, a reducing agent is utilized and serves to break the cerium-oxygen bond; concomitant complexation of the ceria particles serves to facilitate its removal from the surface of the microelectronic device. As used herein, reducing agent(s) contemplated include compounds chosen from hypophosphorous acid ($H_3PO_2$), ascorbic acid, L(+)-ascorbic acid, isoascorbic acid, ascorbic acid derivatives, DEHA (Diethylhydroxylamine), Sulfurous acid, sodium thiosulfate, potassium thiosulfate, ammonium thiosulfate, potassium dithionite, and combinations thereof.

In one embodiment, the composition is substantially devoid or devoid of fluorine compounds and oxidizing agents.

In one embodiment, the composition further comprises an solvent comprising water. Organic additives may also be present. Examples of organic additives include, glycols, and glycol ethers, including, but not limited to, methanol, ethanol, isopropanol, butanol, and higher alcohols (such as $C_2$-$C_4$ diols and $C_2$-$C_4$ triols), tetrahydrofurfuryl alcohol (THFA), halogenated alcohols (such as 3-chloro-1,2-propanediol, 3-chloro-1-propanethiol, 1-chloro-2-propanol, 2-chloro-1-propanol, 3-chloro-1-propanol, 3-bromo-1,2-propanediol, 1-bromo-2-propanol, 3-bromo-1-propanol, 3-iodo-1-propanol, 4-chloro-1-butanol, 2-chloroethanol), dichloromethane, chloroform, acetic acid, propionic acid, trifluoroacetic acid, tetrahydrofuran N-methylpyrrolidinone (NMP), cyclohexylpyrrolidinone, N-octylpyrrolidinone, N-phenylpyrrolidinone, methyldiethanolamine, methyl formate, dimethyl formamide (DMF), dimethylsulfoxide (DMSO), tetramethylene sulfone (sulfolane), diethyl ether, phenoxy-2-propanol (PPh), propriophenone, ethyl lactate, ethyl acetate, ethyl benzoate, acetonitrile, acetone, ethylene glycol, propylene glycol (PG), 1,3-propanediol, dioxane, butyryl lactone, butylene carbonate, ethylene carbonate, propylene carbonate, dipropylene glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether (i.e., butyl carbitol), triethylene glycol monobutyl ether, ethylene glycol monohexyl ether, diethylene glycol monohexyl ether, ethylene glycol phenyl ether, propylene glycol methyl ether, dipropylene glycol methyl ether (DPGME), tripropylene glycol methyl ether (TPGME), dipropylene glycol dimethyl ether, dipropylene glycol ethyl ether, propylene glycol n-propyl ether, dipropylene glycol n-propyl ether (DPGPE), tripropylene glycol n-propyl ether, propylene glycol n-butyl ether, dipropylene glycol n-butyl ether, tripropylene glycol n-butyl ether, propylene glycol phenyl ether, dipropylene glycol methyl ether acetate, tetraethylene glycol dimethyl ether (TEGDE), dibasic ester, glycerine carbonate, N-formyl morpholine, triethyl phosphate, polystyrene sulfonic acid (PSSA), and combinations thereof.

In each embodiment, the removal composition can be substantially devoid of at least one of oxidizing agents; fluoride-containing sources; tetramethylammonium hydroxide;

chemical mechanical polishing abrasive materials (e.g., silica, alumina, etc.); and corrosion inhibitors selected from the group consisting of cyanuric acid, barbituric acid and derivatives thereof, glucuronic acid, squaric acid, alpha-keto acids, adenosine and derivatives thereof, ribosylpurines and derivatives thereof, purine compounds and derivatives thereof, degradation products of adenosine and adenosine derivatives, triaminopyrimidine and other substituted pyrimidines, purine-saccharide complexes, phenanthroline, glycine, nicotinamide and derivatives thereof, flavonoids such as flavonols and anthocyanins and derivatives thereof, quercitin and derivatives thereof, and combinations thereof, prior to removal of residue material from the microelectronic device. In addition, the removal compositions should not solidify to form a polymeric solid.

The complexing agent may be a multi-functional amine including, but not limited to, 4-(2-hydroxyethyl)morpholine (HEM), 1,2-cyclohexanediamine-N,N,N',N'-tetraacetic acid (CDTA), Hydroxyethyldiethylenetraminetriacetic acid (HEDTA), ethylenediaminetetraacetic acid (EDTA), m-xylenediamine (MXDA), iminodiacetic acid (IDA), trimethylamine, isopropanolamine, diisopropanolamine, piperazine, hydroxyethylpiperazine, dihydroxyethylpiperizine, glucamine, N-methylglucamine, 2-(hydroxyethyl)iminodiacetic acid (HIDA), nitrilotriacetic acid, thiourea, 1,1,3,3-tetramethylurea, urea, urea derivatives, uric acid, alanine, arginine, asparagine, aspartic acid, cysteine, glutamic acid, glutamine, histidine, isoleucine, leucine, lysine, methionine, phenylalanine, proline, serine, threonine, tryptophan, tyrosine, valine, Taurine, betaine, and combinations thereof.

Alternatively, or in addition to the aforementioned complexing agents, additional complexing agents can include phosphonates (e.g., 1-hydroxyethylidene-1,1-diphosphonic acid (HEDP), 1,5,9-triazacyclododecane-N,N',N"-tris(methylenephosphonic acid) (DOTRP), 1,4,7,10-tetraazacyclododecane-N,N',N",N'''-tetrakis(methylenep-hosphonic acid) (DOTP), nitrilotris(methylene)triphosphonic acid, diethylenetriaminepentakis(methylenephosphonic acid) (DETAP), aminotri(methylenephosphonic acid), bis(hexamethylene) triamine pentamethylene phosphonic acid, 1,4,7-triazacyclononane-N,N',N"-tris(methylenephosphonic acid (NOTP), hydroxyethyldiphosphonate, nitrilotris(methylene)phosphonic acid, 2-phosphono-butane-1,2,3,4-tetracarboxylic, carboxy ethyl phosphonic acid, aminoethyl phosphonic acid, glyphosate, ethylene diamine tetra(methylenephosphonic acid) phenylphosphonic acid, salts thereof, and derivatives thereof) and/or carboxylic acids (e.g., oxalic acid, succinnic acid, maleic acid, malic acid, malonic acid, adipic acid, phthalic acid, citric acid, sodium citrate, potassium citrate, ammonium citrate, tricarballylic acid, trimethylolpropionic acid, picolinic acid, dipicolinic acid, salicylic acid sulfosalicylic acid, sulfophthalic acid, Sulphosuccinic acid, Betaine anhydrous, gluconic acid, tartaric acid, glucuronic acid, 2-carboxypyridine) and/or sulfonic acids such as tiron (4,5-Dihydroxy-1,3-benzenedisulfonic acid disodium salt. Betaine anhydrous). In certain embodiments, the complexing agent includes nitrilo(tris-methylenephosphonic acid) and iminodiacetic acid. In certain embodiments, the at least one complexing agent comprises a species chosen from monoethanolamine, triethanolamine, sulfuric acid, citric acid and combinations thereof. The amount of complexing agent(s) in the removal composition is in one embodiment, in a range from about 0.01 wt % to about 10 wt %, based on the total weight of the removal composition.

Suitable pH adjusting agents include acids and/or bases. Bases include, but are not limited to, potassium hydroxide, ammonium hydroxide (i.e., ammonia), and a tetraalkylammonium hydroxide compound having the formula $NR^4R^5R^6R^7OH$, wherein $R^4$, $R^5$, $R^6$ and $R^7$ may be the same as or different from one another and are selected from the group consisting of hydrogen, straight-chain or branched $C_1$-$C_6$ alkyl (e.g., methyl, ethyl, propyl, butyl, pentyl, and hexyl) groups, $C_1$-$C_6$ hydroxyalkyl (e.g., hydroxymethyl, hydroxyethyl, hydroxypropyl, hydroxybutyl, hydroxypentyl, and hydroxyhexyl) groups, and substituted or unsubstituted $C_6$-$C_{10}$ aryl groups (e.g., benzyl groups). Tetraalkylammonium hydroxides that are commercially available include tetramethylammonium hydroxide (TMAH), tetraethylammonium hydroxide (TEAH), tetrapropylammonium hydroxide (TPAH), tetrabutylammonium hydroxide (TBAH), tributylmethylammonium hydroxide (TBMAH), benzyltrimethylammonium hydroxide (BTMAH), choline hydroxide, ethyltrimethylammonium hydroxide, tris(2-hydroxyethyl)methyl ammonium hydroxide, diethyldimethylammonium hydroxide, and combinations thereof, may be used. Alternatively or in addition, the pH adjusting agent may be a quaternary base having the formula $(PR_8R^9R^{10}R^{11})OH$, wherein $R^8$, $R^9$, $R^{10}$, and $R^{11}$ may be the same as or different from one another and are selected from the group consisting of hydrogen, straight-chain $C_1$-$C_6$ alkyl (e.g., methyl, ethyl, propyl, butyl, pentyl, and hexyl) groups, branched $C_1$-$C_6$ alkyl groups, $C_1$-$C_6$ hydroxyalkyl (e.g., hydroxymethyl, hydroxyethyl, hydroxypropyl, hydroxybutyl, hydroxypentyl, and hydroxyhexyl) groups, substituted $C_6$-$C_{10}$ aryl groups, unsubstituted $C_6$-$C_{10}$ aryl groups (e.g., benzyl groups), and any combination thereof, such as tetrabutylphosphonium hydroxide (TBPH), tetramethylphosphonium hydroxide, tetraethylphosphonium hydroxide, tetrapropylphosphonium hydroxide, benzyltriphenylphosphonium hydroxide, methyl triphenylphosphonium hydroxide, ethyl triphenylphosphonium hydroxide, N-propyl triphenylphosphonium hydroxide. Acids include, but are not limited to, nitric acid, sulfuric acid, phosphoric acid, hydrochloric acid, hydrobromic acid, methanesulfonic acid, benzenesulfonic acid, p-toluenesulfonic acid, trifluoromethanesulfonic acid, acetic acid, lactic acid, glycolic acid, and any combination thereof. In one embodiment, the pH adjusting agent is chosen from at least one of KOH and CsOH. In another embodiment, the pH adjusting agent comprises choline hydroxide. In yet another embodiment, the pH adjusting agent comprises ammonium hydroxide. In another embodiment, the pH adjusting agent comprises KOH and at least one additional hydroxide enumerated herein. In still another embodiment, the pH adjusting agent comprises KOH and at least one of choline hydroxide and ammonium hydroxide. To any of these enumerated embodiments, the pH adjusting agent can further include at least one acid, for example, nitric acid, sulfuric acid, phosphoric acid or a combination thereof.

In one embodiment of the present invention, the pH will be adjusted to be above about 9, and in another embodiment, above 13, or about 13.1. In one embodiment of the present invention, the pH will be adjusted to be below 6, or about 4 to about 6, and in another embodiment about 6.

Polymers, when present, include, but are not limited to, methacrylic acid homopolymer and copolymers with, for example, acrylamidomethylpropane sulfonic acid and maleic acid; maleic acid/vinyl ether copolymer; poly(vinylpyrrolidone)/vinyl acetate; homopolymers such as phosphonated polyethyleneglycol oligomers, poly(acrylic acid) (PAA), poly(acrylamide), poly(vinyl acetate), poly(ethylene glycol) (PEG), polypropylene glycol) (PPG), poly(styrene sulfonic acid), poly(vinyl sulfonic acid), poly(vinyl phosphonic acid), poly(vinyl phosphoric acid), poly(ethyleneimine), poly(propyleneimine), polyallylamine, polyethylene oxide (PEO), polyvinyl pyrrolidone (PVP), PPG-PEG-PPG block copolymers, PEG-PPG-PEG block copolymers, poly (vinyl alcohol), poly(hydroxyethyl)acrylate, poly(hydroxyethyl)methacrylate, hydroxyethyl cellulose, methylhydroxyethyl cellulose, hydroxypropyl cellulose, methylhydroxypropyl cellulose, xanthan gum, potassium alginate, pectin, carboxymethylcellulose, glucosamine, poly (diallyldimethylammonium) chloride, polyAMPS, PVA AMPS copolymers (wherein "AMPS" denotes poly(2-acrylamido-2-methyl-1-propanesulfonic acid), PEGylated (i.e., polyethyleneglycol-ated) methacrylate/acrylate copolymers, poly MADQuat and copolymers thereof, dimethylaminomethacrylate polymers and compolymers thereof, trimethylammonium methylmethacrylate polymers and copolymers thereof, and combinations thereof. The copolymers above may be random or block copolymers. When present, the amount of polymer(s) in the composition is in a range from about 0.0001 weight % to about 5 weight %, based on the total weight of the composition.

The compositions are easily formulated by simple addition of the respective ingredients and mixing to homogeneous condition. Furthermore, the compositions may be readily formulated as single-package formulations or multipart formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

With regard to compositional proportions, in certain embodiments, the surfactant is present in an amount of about 0.01 to 0.5 weight percent, the total of (i), (ii), (iii), (iv), and (v) being equal to 100 weight percent. In certain embodiments, the complexing agent is present in an amount of about 1 to 5 weight percent, the total of (i), (ii), (iii), (iv), and (v) being equal to 100 weight percent. In certain embodiments, the organic additive is present in an amount of about 0.5 to 2.5 weight percent. In certain embodiments, component (v) is present in an amount of about 1 to 5 weight percent, the total of (i), (ii), (iii), (iv), and (v) being equal to 100 weight percent.

The amount of the pH adjusting agent is dependent on the final pH sought when preparing the removal composition for use, based on the pH values disclosed herein, and the knowledge of the person skilled in the art.

The range of weight percent ratios of the components will cover all possible concentrated or diluted embodiments of the composition. Towards that end, in one embodiment, a concentrated removal composition is provided that can be diluted for use as a cleaning solution. A concentrated composition, or "concentrate," advantageously permits a user (e.g. a CMP process engineer) to dilute the concentrate to the desired strength and pH at the point of use. Dilution of the concentrated aqueous removal composition may be in a range from about 1:1 to about 2500:1, about 5:1 to about 200:1, or about 20:1 to about 120:1, wherein the aqueous removal composition is diluted at or just before the tool with solvent, e.g., deionized water. It is to be appreciated by one skilled in the art that following dilution, the range of weight percent ratios of the components disclosed herein should remain unchanged.

The compositions described herein may have utility in applications including, but not limited to, post-etch residue removal, post-ash residue removal surface preparation, post-plating cleaning and post-CMP residue removal. In addition, it is contemplated that the aqueous cleaning compositions described herein may be useful for the cleaning and protection of other metal (e.g., copper-containing and tungsten-containing) products including, but not limited to, decorative metals, metal wire bonding, printed circuit boards and other electronic packaging using metal or metal alloys.

In yet another embodiment, the removal compositions described herein further includes ceria particles and/or CMP contaminants. The ceria particles and contaminants become a component of the removal composition after cleaning has begun and will be dissolved and/or suspended in the compositions.

The removal compositions are easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Accordingly, another aspect relates to a kit including, in one or more containers, one or more components adapted to form the compositions described herein. The kit may include, in one or more containers, (i) at least one surfactant; (ii) at least one pH adjuster; (iii) at least one complexing agent; (iv) at least one organic additive; and alternately (v) at least one nucleophilic compound or reducing agent, for combining with additional solvent (e.g., water) at the fab or the point of use. The containers of the kit must be suitable for storing and shipping the compositions and may be, for example, NOWPak® containers (Entegris, Inc., Billerica, Mass., USA).

In one embodiment, the one or more containers which contain the components of the aqueous removal composition include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, in certain embodiments the system includes a dispensing port for dispensing the blended removal composition to a process tool.

As applied to microelectronic manufacturing operations, the removal compositions described herein are usefully employed to clean ceria particles and/or CMP contaminants (e.g., post-CMP residue and contaminants) from the surface of the microelectronic device. The removal compositions do not damage low-k dielectric materials (e.g., silicon oxide), silicon nitride layers, or tungsten-containing layers on the device surface. In one embodiment, the aqueous removal compositions remove at least 85% of the ceria particles present on the device prior to particle removal, at least 90%, at least 95%, or at least 99%.

Accordingly, in a further aspect, the invention provides a method for removing ceria particles and chemical mechanical polishing contaminants from a microelectronic device having said particles and contaminants thereon, said method comprising:
  (i) contacting the microelectronic device with the compositions of the invention; and
  (ii) at least partially removing said particles and contaminants from said microelectronic device, wherein said microelectronic device comprises a substrate chosen from Poly-Si, PETEOS, and silicon nitride.

In post-CMP particle and contaminant removal applications, the aqueous removal composition described herein may be used with a large variety of conventional cleaning tools such as megasonics and brush scrubbing, including, but not limited to, Verteq single wafer megasonic Goldfinger, OnTrak systems DDS (double-sided scrubbers), SEZ or other single wafer spray rinse, Applied Materials Mirra-Mesa™/Reflexion™/Reflexion LK™, and Megasonic batch wet bench systems.

In use of the compositions described herein for removing ceria particles and CMP contaminants from microelectronic devices having same thereon, the aqueous removal composition typically is contacted with the device for a time of from about 5 seconds to about 10 minutes, or about 1 sec to 20 min, or about 15 sec to about 5 minutes at temperature in a range of from about 20° C. to about 90° C., or about 20° C. to about 50° C. Such contacting times and temperatures are illustrative, and any other suitable time and temperature conditions may be employed that are efficacious to at least partially remove the ceria particles and CMP contaminants from the device, within the broad practice of the method. "At least partially clean" and "substantial removal" both correspond in certain embodiments to at removal of at least 85% of the ceria particles present on the device prior to particle removal, at least 90%, at least 95%, or at least 99%.

Following the achievement of the desired particle removal action, the aqueous removal composition may be readily removed from the device to which it has previously been applied, as may be desired and efficacious in a given end use application of the compositions described herein. In one embodiment, the rinse solution includes deionized water. Thereafter, the device may be dried using nitrogen or a spin-dry cycle.

Yet another aspect relates to the improved microelectronic devices made according to the methods described herein and to products containing such microelectronic devices.

Another aspect relates to a recycled aqueous removal composition, wherein the removal composition may be recycled until particle and/or contaminant loading reaches the maximum amount the aqueous removal composition may accommodate, as readily determined by one skilled in the art.

A still further aspect relates to methods of manufacturing an article comprising a microelectronic device, said method comprising contacting the microelectronic device with an aqueous removal composition for sufficient time to remove ceria particles and CMP contaminants from the microelectronic device having said particles and contaminants thereon, and incorporating said microelectronic device into said article, using a removal composition described herein.

In another aspect, a method of removing ceria particles and CMP contaminants from a microelectronic device having same thereon is described. The method comprises polishing the microelectronic device with a CMP slurry, wherein the CMP slurry comprises ceria particles; contacting the microelectronic device with an aqueous removal composition comprising at least one pH adjusting agent, at least one reducing agent, at least one organic additive, water, optionally at least one complexing agent, optionally at least one polymer, and optionally at least one oxygen scavenger, for a sufficient time to remove ceria particles and CMP contaminants from the microelectronic device to form a post-CMP particle-containing composition; and continuously contacting the microelectronic device with the post-CMP particle-containing composition for a sufficient amount of time to effect substantial cleaning of the microelectronic device. Any of the components described above may be used in the present method of removing ceria particles and CMP contaminants.

This invention can be further illustrated by the following examples of preferred embodiments thereof, although it will be understood that these examples are included merely for purposes of illustration and are not intended to limit the scope of the invention unless otherwise specifically indicated.

EXPERIMENTAL SECTION

In Examples 1-28 below, each composition was adjusted to a pH of approximately 13.1 using choline hydroxide in addition to the nucleophilic compound (morpholine) which in these examples was utilized as the cerium-oxygen bond breaking agent.

TABLE 1

| No. | nucleophile/ pH adjuster | Complexing agent | small molecule additive | small molecule additive/surfactant | substrate/ total area as determined by Dark-Field Microscopy |
|---|---|---|---|---|---|
| 1 | Morpholine + Choline | HEDP (0.75%) | PnB (1%) | — | 10838 |
| 2 | Morpholine + Choline | HEDP (2.5%) | PnB (1%) | — | 31954 |
| 3 | Morpholine + Choline | HEDP (0.75%) | PnB (2.5%) | — | 20115 |
| 4 | Morpholine + Choline | HEDP (0.75%) | PnB (1%) | H3PO2 (1.5%) | 78587 |
| 5 | Morpholine + Choline | HEDP (0.75%) | PnB (1%) | Citric acid (2%) | 1117271 |
| 6 | Morpholine + Choline | HEDP (0.75%) | | phenoxy-2-propanol (0.5%) | 13564 |
| 7 | Morpholine + Choline | HEDP (2.5%) | PnB (2.5%) | — | 10067 |
| 8 | Morpholine + Choline | HEDP (2.5%) | — | ethyl-2-(16-methylheptadecyl)-4,5-dihydroimidazol-1-ium-1-yl]ethanol; ethyl sulfate Poly(ethylene glycol)-block-poly(propylene glycol)-block-poly(ethylene glycol) | 5197 |
| 9 | Morpholine + Choline | HEDP (0.75%) | — | 2-[1-ethyl-2-(16-methylheptadecyl)-4,5-dihydroimidazol-1-ium-1-yl]ethanol; ethyl sulfate Poly(ethylene glycol)-block-poly(propylene glycol)-block-poly(ethylene glycol) | 1670 |
| 10 | Morpholine + Choline | HEDP (0.75%) | — | Dipropylene Glycol Dimethyl ether | 8312 |
| 11 | Morpholine + Choline | HEDP (0.75%) | — | Diethylene glycol phenyl ether | 6915 |
| 12 | Morpholine + Choline | HEDP (0.75%) | — | methanesulfonic acid | 20669 |
| 13 | Morpholine + Choline | HEDP (0.75%) | — | Triethylene glycol monobutyl ether | 3000 |
| 14 | Morpholine + Choline | HEDP (0.75%) | — | Diethylene glycol mono-n-butyl ether | 7658 |
| 15 | Morpholine + Choline | HEDP (0.75%) | — | Ehylene glycol monohexyl ether | 4115 |
| 16 | Morpholine + Choline | — | — | aminotris(methylene phosphonic acid), ATMP and Salts | 9440 |

TABLE 1-continued

| No. | nucleophile/ pH adjuster | Complexing agent | small molecule additive | small molecule additive/surfactant | substrate/ total area as determined by Dark-Field Microscopy |
|---|---|---|---|---|---|
| 17 | Morpholine + Choline | HEDP (0.75%) | — | Polyethyene glycol p-(1,1,3,3-tetramethylbutyl)phenyl ether | 252 |
| 18 | Morpholine + Choline | HEDP (0.75%) | — | Polyethylene glycol | 28118 |
| 19 | Morpholine + Choline | HEDP (0.75%) | — | 2,4,7,9-Tetramethyl-5-decyne-4,7-diol | 2248 |
| 20 | Morpholine + Choline | HEDP (0.75%) | — | Dimethyl Sulfoxide | 23432 |
| 21 | Morpholine + Choline | HEDP (0.75%) | — | Propylene glycol methyl ether | 15384 |
| 22 | Morpholine + Choline | HEDP (0.75%) | — | 2-Hydroxyethyl cellulose | 93233 |
| 23 | Morpholine + Choline | HEDP (0.75%) | — | 2,3,4,5-tetrahydrothiophene-1,1-dioxide | 21484 |
| 24 | Morpholine + Choline | HEDP (0.75%) | — | ethoxylated 2,4,7,9-tetramethyl-dec-5-yne-4,7-diol(CAS No. 9014-85-1)(≥70% and <90%) and tetramethyl -dec-5-yne-4,7-diol | 579 |
| 25 | Morpholine + Choline | HEDP (0.75%) | — | Cocoamidopropyl Betaine | 7836 |
| 26 | Morpholine + Choline | HEDP (0.75%) | — | Poly(ethylene glycol)-block-poly(propylene glycol)-block-poly(ethylene glycol) | 1542 |
| 27 | Morpholine + Choline | HEDP (0.75%) | — | polyethylene glycol sorbitan monooleate | 8721 |
| 28 | Morpholine + Choline | HEDP (0.75%) | — | piparizine | 12141 |

In the Examples below, a substrate coupon is placed in a ceria-slurry for 5 min followed by 30 sec in deionized water (DIW) to remove any adsorbed or any loosely bound species. The DIW treated coupon is placed in a cleaner solution for 1 min followed by rinsing with DIW for 30 seconds. The substrate is air dried and the remaining area covered by the ceria is calculated via SEM (scanning electron microscopy) method. In these examples, the pH of the aqueous composition was adjusted to approximately 6.1 using choline hydroxide.

TABLE 2

| No. | base additives | other additives/surfactant | substrate / total area as determined by Dark-Field Microscopy |
|---|---|---|---|
| 29 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Glycol ether | 4812 |
| 30 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | 2-[1-ethyl-2-(16-methylheptadecyl)-4,5-dihydroimidazol-1-ium-1-yl]ethanol]; ethyl sulfate<br>Poly(ethylene glycol)-block-poly(propylene glycol)-block-polyethylene glycol) | 217062 |
| 31 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | 2-[1-ethyl-2-(16-methylheptadecyl)-4,5-dihydroimidazol-1-ium-1-yl]ethanol; ethyl sulfate<br>Poly(ethylene glycol)-block-poly(propylene glycol)-block-poly(ethylene glycol) | 24491 |
| 32 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Dipropylene glycol dimethyl ether | 5252 |

TABLE 2-continued

| No. | base additives | other additives/surfactant | substrate / total area as determined by Dark-Field Microscopy |
|---|---|---|---|
| 33 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Diethylene glycol phenyl ether | 3278 |
| 34 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Triethylene glycol monobutyl ether (butyl carbitol,) | 3084 |
| 35 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Ethylene glycol monohexyl ether | 4978 |
| 36 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | aminotris(methylene phosphonic acid), ATMP and Salts | 3857 |
| 37 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Polyethyene glycol p-(1,1,3,3-tetramethylbutyl)phenyl ether | 114865 |
| 38 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | 2,4,7,9-Tetramethyl-5-decyne-4,7-dial (Surfynol 104) | 3146 |
| 39 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Dimethyl sulfoxide | 8234 |
| 40 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | nonionic detergent, (ethoxylated alkyl phenol with an average of 40 ethoxy groups) | 13090 |
| 41 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Cocoamidopropyl Betaine | 40573 |
| 42 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Poly(ethylene glycol)-block-poly(propylene glycol)-block-poly(ethylene glycol) | 16818 |
| 43 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | polyethylene glycol sorbitan monooleate | 3237 |

TABLE 2-continued

| No. | base additives | other additives/surfactant | substrate / total area as determined by Dark-Field Microscopy |
|---|---|---|---|
| 44 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | Coco alkylbis (hydroxyethyl) methyl, ethoxylated, methyl sulfate (salts) | 10460 |
| 45 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | ethoxylated 2,4,7,9-tetramethyl-dec-5-yne-4,7-diol(CAS No. 9014-85-1)(≥70% and <90%) and tetramethyl-dec-5-yne-4,7-diol | 21517 |
| 46 | Citric Acid: 6%<br>PPh: 0.5%<br>$H_3PO_2$: 1.5%<br>$H_2SO_4$: 0.99%<br>$NH_4OH$: 2.5-2.7%<br>Choline: 0.45% | 2,3,4,5-tetrahydrothiophene-1,1-dioxide | 199915 |

In the Examples below, the defects were determined by polishing blanket TEOS wafers with a commercially available ceria slurry on a AMAT Mirra tool and then brush cleaned using Entegris Planarcore® brushes. The wafers were then analyzed on an KLA-Tencore SP1 for total defects at 110 nm threshold.

TABLE 3

| No. | Base Additives | Other Additives | pH | total Defects counts |
|---|---|---|---|---|
| 47 | 3% AA + 1% CA + 1% H2SO4 + 1% AcAc + 6% DMSO + NH4OH | No additive | 2 | 564 |
| 48 | 3% AA + 1% CA + 1% H2SO4 + 1% AcAc + 6% DMSO + NH4OH | 0.5% PAA | 1.5 | 179 |
| 49 | 3% AA + 1% CA + 1% H2SO4 + 1% AcAc + 6% DMSO + NH4OH | 1% HEPES | 1.5 | 606 |
| 50 | 3% AA + 1% CA + 1% H2SO4 + 1% AcAc + 6% DMSO + NH4OH | 1% HNO3 | 1.5 | 665 |
| 51 | 3% AA + 1% CA + 1% H2SO4 + 1% AcAc + 6% DMSO + NH4OH | 1% Picolinic acid | 1.5 | 783 |
| 52 | 3% AA + 1% CA + 1% H2SO4 + 1% AcAc + 6% DMSO + NH4OH | 0.5% PEG (mw 10000) | 1.5 | 395 |
| 53 | 3% AA + 1% CA + 1% H2SO4 + 1% AcAc + 6% DMSO + NH4OH | 0.5% ALS | 1.5 | 848 |
| 54 | 3% AA + 1% CA + 1% H2SO4 + 1% AcAc + 6% DMSO + NH4OH | 0.01% HEC | 1.5 | 381 |
| 55 | 6% AA + 1% CA + 2.5% AcAc + 1% HNO3 | PAA = 0.5 + TGME = 2.5 | 6 | 95 |
| 56 | 6% AA + 1% CA + 2.5% AcAc + 1% HNO3 | Acetic Acid = 5% | 1.5 | 119 |

Having thus described several illustrative embodiments of the present disclosure, those of skill in the art will readily appreciate that yet other embodiments may be made and used within the scope of the claims hereto attached. Numerous advantages of the disclosure covered by this document have been set forth in the foregoing description. It will be understood, however, that this disclosure is, in many respect, only illustrative. Changes may be made in details, particularly in matters of shape, size, and arrangement of parts without exceeding the scope of the disclosure. The disclosure's scope is, of course, defined in the language in which the appended claims are expressed.

We claim:

1. A composition comprising
   (i) at least one surfactant
   (ii) at least one pH adjuster;
   (iii) at least one complexing agent;
   (iv) at least one organic additive; and
   (v) alternately at least one nucleophilic compound or reducing agent, wherein said nucleophilic compound is present when said composition possesses a pH of greater than 13, and wherein said reducing agent is present when said composition possesses a pH below 6 wherein the composition is substantially devoid of oxidizing agents.

2. The composition of claim 1, wherein said surfactant is present in an amount of about 0.01 to 0.5 weight percent, the total of (i), (ii), (iii), (iv), and (v) being equal to 100 weight percent.

3. The composition of claim 1, wherein said complexing agent is present in an amount of about 1 to 5 weight percent, the total of (i), (ii), (iii), (iv), and (v) being equal to 100 weight percent.

4. The composition of claim 1, wherein the organic additive is present in an amount of about 0.5 to 2.5 weight percent.

5. The composition of claim 1, wherein the nucleophilic compound is chosen from morpholine, monoethanolamine, isopropyl amine, diisopropanolamine, diglycolamine, triethylamine, N-methylmorpholine, methylethanolamine, N-aminopropyl morpholine, and 3-amino-propanol.

6. The composition of claim 5, wherein the nucleophilic compound is morpholine.

7. The composition of claim 1, wherein the reducing agent is hypophosphorous acid.

8. The composition of claim 1 wherein the pH adjuster is chosen from choline hydroxide, ammonium hydroxide, potassium hydroxide, cesium hydroxide, tetraethyl ammonium hydroxide, ethyltrimethylammonium hydroxide, methyltriethylammonium hydroxide, diethyldimethylammonium hydroxide.

9. The composition of claim 8, wherein the pH adjuster is potassium hydroxide.

10. The composition of claim 8, wherein the pH adjuster is choline hydroxide.

11. The composition of claim 1, wherein the complexing agent is selected from aminotri(methylenephosphonic) acid, 1-hydroxyethane-1,1-diphosphonic acid, diethylenetriaminepentakis(methylene phosphonic acid), ethylene diamineetetrakis(methylene phosphonic acid), iminodiactetic acid, hydroxyethylethylenediaminetriaceticacid, diethylene triaminepentaacetic acid.

12. The composition of any one of claim 1, wherein the complexing agent is 1-hydroxyethane-1,1-diphosphonic acid, and nitrilo(tris-methylenephosphonic acid), or iminodiacetic acid.

13. The composition of claim 1, wherein the organic additive is chosen from propylene glycol butyl ether, diethylene glycol monobutyl ether, triethylene glycol monobutyl ether, ethylene glycol monobutyl ether, ethylene glycol monohexyl ether, and sulfolane.

14. The composition of claim 1, wherein the surfactant is chosen from 2,4,7,9-tetramethyl-5-decyne-4,7-diol, polyethylene glycol 2,4,7,9-tetramethyl-5-decyne-4,7-diol, poly (ethylene glycol)/polypropylene glycol copolymers, nonylphenol ethoxylates, and fatty alcohol ethoxylates.

15. A composition comprising
(i) at least one surfactant
(ii) at least one pH adjuster;
(iii) at least one complexing agent
(iv) at least one organic additive; and
(v) alternately at least one nucleophilic compound or reducing agent, wherein said nucleophilic compound is present when said composition possesses a pH of about 11 to 13.7, and wherein said reducing agent is present when said composition possesses a pH below 6,
wherein the composition comprises:
(ii) choline hydroxide;
(iii) 1-hydroxyethane-1,1-diphosphonic acid;
(iv) propylene glycol n-butyl ether; and
(v) morpholine;
and further comprises water.

16. A composition comprising
(i) at least one surfactant
(ii) at least one pH adjuster;
(iii) at least one complexing agent;
(iv) at least one organic additive; and
(v) alternately at least one nucleophilic compound or reducing agent, wherein said nucleophilic compound is present when said composition possesses a pH of about 11 to 13.7, and wherein said reducing agent is present when said composition possesses a pH below 6,
wherein the composition comprises:
(ii) choline hydroxide;
(iii) 1-hydroxyethane-1,1-diphosphonic acid;
(iv) at least one of triethylene glycol monobutyl ether and propylene glycol methyl ether; and
(v) morpholine;
and further comprises water.

17. The composition of claim 1, wherein said composition comprises said at least one nucleophilic compound and possesses a pH of greater than 13.

18. The composition of claim 1, wherein said composition comprises said reducing agent and possesses a pH of below 6.

* * * * *